United States Patent
Werner et al.

(10) Patent No.: US 6,998,678 B2
(45) Date of Patent: Feb. 14, 2006

(54) SEMICONDUCTOR ARRANGEMENT WITH A MOS-TRANSISTOR AND A PARALLEL SCHOTTKY-DIODE

(75) Inventors: Wolfgang Werner, München (DE); Franz Hirler, Isen (DE); Joachim Krumrey, München (DE); Walter Rieger, Arnoldstein (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/147,546

(22) Filed: May 16, 2002

(65) Prior Publication Data

US 2003/0020134 A1    Jan. 30, 2003

(30) Foreign Application Priority Data

May 17, 2001 (DE) ............................ 101 24 115
Mar. 28, 2002 (DE) ............................ 102 14 160

(51) Int. Cl.
*H01L 29/94*    (2006.01)
(52) U.S. Cl. ........................... 257/334; 257/471
(58) Field of Classification Search ............. 257/334, 257/471, 369, 368, 331, 155; 438/268, 237, 438/570, 571
See application file for complete search history.

(56) References Cited

U.S. PATENT DOCUMENTS

| 4,811,065 | A |   | 3/1989  | Cogan |
|-----------|---|---|---------|-------|
| 5,693,569 | A |   | 12/1997 | Ueno |
| 6,049,108 | A |   | 4/2000  | Williams et al. |
| 6,118,150 | A |   | 9/2000  | Takahashi |
| 6,133,107 | A | * | 10/2000 | Menegoli ............. 438/306 |
| 6,351,018 | B1 | * | 2/2002 | Sapp ................... 257/499 |
| 6,433,396 | B1 | * | 8/2002 | Kinzer ................ 257/369 |

FOREIGN PATENT DOCUMENTS

WO       WO 00/51167        8/2000

OTHER PUBLICATIONS

R.W. Erickson, "Fundamental of Power Electronics," Univ. Colorado Press (2000) Chap. 4, 4.2, pp. 1-18.*

* cited by examiner

*Primary Examiner*—Douglas W. Owens
(74) *Attorney, Agent, or Firm*—Laurence A. Greenberg; Werner H. Stemer; Ralph E. Locher

(57) ABSTRACT

The present invention relates to a semiconductor arrangement with a MOS transistor which has a gate electrode (40), arranged in a trench running in the vertical direction of a semiconductor body (100), and a Schottky diode which is connected in parallel with a drain-source path (D-S) and is formed by a Schottky contact between a source electrode and the semiconductor body.

22 Claims, 10 Drawing Sheets

US 6,998,678 B2

SEMICONDUCTOR ARRANGEMENT WITH A MOS-TRANSISTOR AND A PARALLEL SCHOTTKY-DIODE

BACKGROUND OF THE INVENTION

Field of the Invention

The present invention relates to a semiconductor arrangement with a MOS transistor and a Schottky diode connected in parallel with the drain-source path of the MOS transistor.

A semiconductor arrangement of this type is disclosed for example in U.S. Pat. No. 4,811,065. The known semiconductor arrangement has a transistor designed as a DMOS transistor and having a gate electrode arranged above the semiconductor body, in which case, when a drive voltage is applied, a conductive channel is formed in the lateral direction of the semiconductor body in a body region—situated below the gate electrode—between a source zone and a drain zone. In the drain zone, the current flows in the vertical direction of the semiconductor body to a drain electrode arranged at the rear side of the semiconductor body. In the known semiconductor arrangement, the Schottky diode is formed by a metal-semiconductor junction between a source electrode and the drain zone.

Semiconductor arrangements of this type are used as power components for switching loads, in particular for switching inductive loads, such as motors for example. As long as the transistor is operated in the forward direction, that is to say as long as a positive drain-source voltage is present in the case of an n-conducting MOSFET, the Schottky diode is in the off state. The Schottky diode turns on and acts as a freewheeling element if the transistor is operated with a voltage in the reverse direction, that is to say if an n-conducting MOSFET is operated with a negative drain-source voltage. Such a voltage in the reverse direction ("reverse voltage") can occur when switching inductive loads by means of the MOSFET as a result of the voltage induced in the load after the MOSFET has turned off.

The Schottky diode is connected in parallel with a body diode which is present in the MOSFET in parallel with the drain-source path and is formed by a pn junction between the body region and the drain zone and by the short-circuiting of the body region to the source zone. The forward voltage of the Schottky diode is lower than the forward voltage of said body diode, so that the Schottky diode always turns on before the body diode turns on. Unlike in the case of the body diode, charge carriers which have to be conducted away again in order to turn off the diode are not stored in the Schottky diode during the on state. In comparison with the body diode as freewheeling element, the use of the Schottky diode as freewheeling element reduces the switching losses which occur when switching an inductive load and are not inconsiderable particularly at high switching frequencies.

The Schottky diode therefore makes it possible for the stored charges which occur in a DMOS transistor during the switching operation thereof to be conducted away as majority charge carrier current, so that power losses caused by said stored charges can be avoided.

WO 00/51167 discloses a semiconductor arrangement by means of which a MOSFET with a parallel Schottky diode is realized. The MOSFET is formed as a trench MOSFET with a multiplicity of identical transistor cells. In this case, each of the cells has a gate electrode formed in a trench of a semiconductor body, source, body and drain zones being formed adjacent to side areas of said gate electrodes. In order to realize the Schottky diode, special "Schottky cells" are provided which are formed by virtue of the fact that in semiconductor regions, between some of the gate electrodes, no source and body zones are provided and, in these regions, the drain zone extends from the rear side as far as the front side of the semiconductor body in order to form a Schottky contact at the front side with a metal layer.

A similar semiconductor arrangement is disclosed in U.S. Pat. No. 6,049,108. A parallel circuit comprising a MOSFET and a Schottky diode is realized by this semiconductor arrangement, too, the MOSFET being realized as a trench MOSFET with a multiplicity of identically constructed transistor cells. Here, too, separate "Schottky cells" are provided in order to form the Schottky diode, in which cells the drain zone extends between adjacent gate electrodes as far as the front side of the semiconductor body.

The provision of separate "Schottky cells" in the cell array of a transistor on the one hand requires additional method steps, since these cells cannot be formed by the same processes as the transistor cells, and on the other hand increases the area required for realizing a transistor with a given current-carrying strength.

SUMMARY OF THE INVENTION

It is an aim of the present invention, therefore, to provide a semiconductor arrangement with a MOS transistor and a Schottky diode in parallel with the MOS transistor which can be realized in a space-saving manner.

The semiconductor arrangement according to the invention has a semiconductor body having a first terminal zone of a first conduction type, a second terminal zone of the first conduction type and a body zone of a second conduction type, which body zone is formed between the first and second terminal zones, the first terminal zone, the body zone and the second terminal zone being arranged one above the other at least in sections in the vertical direction of the semiconductor body. A control electrode is formed in a manner insulated from the semiconductor body in a trench which extends in the vertical direction of the semiconductor body from the second terminal zone through the body zone right into the first terminal zone. The second terminal zone and the body zone are contact-connected by a terminal electrode which is insulated from the control electrode. Furthermore, in the semiconductor arrangement according to the invention, a Schottky contact is formed between the terminal electrode and the first terminal zone, said Schottky contact being formed in a space-saving manner adjacent to the body zone, or adjacent to the contact area between the terminal electrode and the body zone.

The first terminal zone, which is n-doped in the case of an n-conducting MOS transistor, forms firstly the drain zone of the transistor and secondly the anode of the Schottky diode formed by the first terminal zone and the terminal electrode, the terminal electrode forming the source electrode. The second terminal zone forms the source zone of the MOS transistor and the control electrode forms the gate electrode of the MOS transistor. The source zone and the body zone are short-circuited by the terminal electrode in order to render inactive, in a sufficiently known manner, a parasitic bipolar transistor which is formed by the sequence of the drain zone, the body zone complementary to the drain zone, and the source zone and which would otherwise reduce the maximum blocking voltage of the transistor.

The arrangement of the control electrode in a trench extending in the vertical direction of the semiconductor body makes it possible to realize the semiconductor arrangement with the MOS transistor and the Schottky diode in a particularly space-saving manner. When a drive voltage is applied between the gate electrode and the source zone or the source electrode which contact-connects the source zone, a conductive channel is formed in the body zone along the gate electrode in the vertical direction of the semiconductor body between the source zone and the drain zone.

The semiconductor component according to the invention is preferably constructed in a cell-like manner and thus has a multiplicity of identical structures each having a gate electrode and sequences comprising a source zone, a body zone and a drain zone, said sequences being formed adjacent to the gate electrode. In this case, each of these cells has a Schottky contact adjacent to the body zone between the source electrode and the drain zone.

Moreover, in each of these structures, a Schottky contact may be present adjacent to the contact between the terminal electrode and the body zone, so that all the cells in the semiconductor component according to the invention can thus be constructed identically and can be fabricated by the same method steps. Moreover, the current through the Schottky diode formed from the multiplicity of Schottky contacts is distributed more uniformly over the component than in the case of those semiconductor arrangements according to the prior art in which Schottky contacts are only provided at occasional locations in the cell array of the transistor.

In an additionally explained embodiment, it is provided that, in addition to regions with a Schottky contact, regions are also provided in which there is no Schottky contact present adjacent to the contact between the terminal electrode and the body zone, with the result that regions with a Schottky contact and regions without a Schottky contact alternate.

In one embodiment of the invention, it is provided that the first terminal zone, or the drain zone, extends in sections as far as a front side of the semiconductor body, the Schottky contact being formed at the front side of the semiconductor body between the source electrode and the drain zone beside the contact between the source electrode and the body zone or the contact between the source electrode and the source zone.

In a further embodiment, it is provided that the source electrode is formed in sections in a second trench running in the vertical direction of the semiconductor body, the Schottky contact being formed in the second trench between the source electrode and the drain zone. In this embodiment, the body zone and the source zone are contact-connected and short-circuited by the source electrode at side walls of the second trench.

The semiconductor body is composed of silicon, for example, and the doping of the drain zone following the source electrode in order to form the Schottky contact is in this case preferably less than $1 \cdot 10^{17}$ cm$^{-3}$.

In particular, aluminum, tungsten, tantalum, titanium, platinum or cobalt silicide are suitable as metal of the source electrode for forming the Schottky contact. In this case, the source electrode may completely comprise the materials mentioned or else be formed in a multilayer manner with a thin layer of said material in the region of the Schottky contact and an overlying thicker layer made of aluminum or a highly doped n-type polysilicon.

The Schottky barrier voltage of the Schottky contacts is preferably set by ion implantation.

Furthermore, a second terminal electrode (70) may be provided on that side of the semiconductor body which is opposite to the first terminal electrode, or on the same side of the semiconductor body as the first terminal electrode (drain-up construction).

What is problematic in the case of Schottky diodes is a high leakage current, which is drastically amplified at voltages in the vicinity of the breakdown voltage of the Schottky diodes by avalanche multiplication of the charge carriers. Such a high leakage current may prove to be disadvantageous in various applications, for example in a DC/DC converter.

In one embodiment of the invention, therefore, it is provided that regions with Schottky contacts are provided in some transition regions of the cell array between the first terminal electrode and the first terminal zone and regions without Schottky contacts are provided in other transition regions. In this case, regions with a Schottky contact and regions without a Schottky contact may regularly alternate or there may be some regions with a Schottky contact which are followed by some regions without a Schottky contact. The regions with a Schottky contact preferably have a higher breakdown voltage than the regions without a Schottky contact.

This "alternating" arrangement of regions with a Schottky contact and regions without a Schottky contact means that the avalanche multiplication of the leakage current of the Schottky diodes does not take effect. Furthermore, the electric field at the Schottky contact is limited and degradation by avalanche multiplication of the charge carriers is prevented. An increase in the leakage current can thus be avoided.

In regions between the first terminal zone and the first terminal electrode between which no Schottky contact is intended to be formed, the first terminal zone is preferably doped with charge carriers of the second conduction type, which is complementary to the remaining doping of the first terminal zone and corresponds to the conduction type of the body zone. In these regions, instead of a Schottky contact, a pn junction is thus formed between the first terminal electrode and the first terminal zone. These regions of the second conduction type in the first terminal zone following the first terminal electrode are preferably doped more highly than the first terminal zone. These more highly doped regions without a Schottky contact in the first terminal zone adjoin the body zone and preferably also serve as contact for the body zone.

The regions without a Schottky contact with the doping that is complementary to the remaining doping of the first terminal zone may be arranged in the semiconductor component at positions corresponding to those of the regions with a Schottky contact. In other words, in an embodiment in which the first terminal zone extends in sections as far as the front side of the semiconductor body, the regions with a Schottky contact and the regions without a Schottky contact may be formed at the front side of the semiconductor body. In an embodiment in which the first terminal electrode is formed in sections in a further trench running in the vertical direction of the semiconductor body, the regions with a Schottky contact and the regions without a Schottky contact are formed in a manner adjoining the further trench.

Preferably the Mesa regions which are formed between the trenches with the control electrodes and in which are situated the body zones, the second terminal zones and, if appropriate, the further trenches with the first terminal electrode are narrower in regions with a Schottky contact than in regions without a Schottky contact. The body zone and the source zone are connected in a customary manner to side walls of the second trench and are contact-connected and short-circuited by the source electrode. In order to improve the, for example, p-type connection of the body zone, a p⁺-type implantation may be performed into the side walls of said trench.

BRIEF DESCRIPTION OF THE DRAWINGS

The present invention is explained in more detail below using exemplary embodiments with reference to figures, in which.

DESCRIPTION OF THE PREFERRED EMBODIMENTS

In the figures, unless specified otherwise, identical reference symbols designate identical parts and regions with the same meaning.

Figure 1:
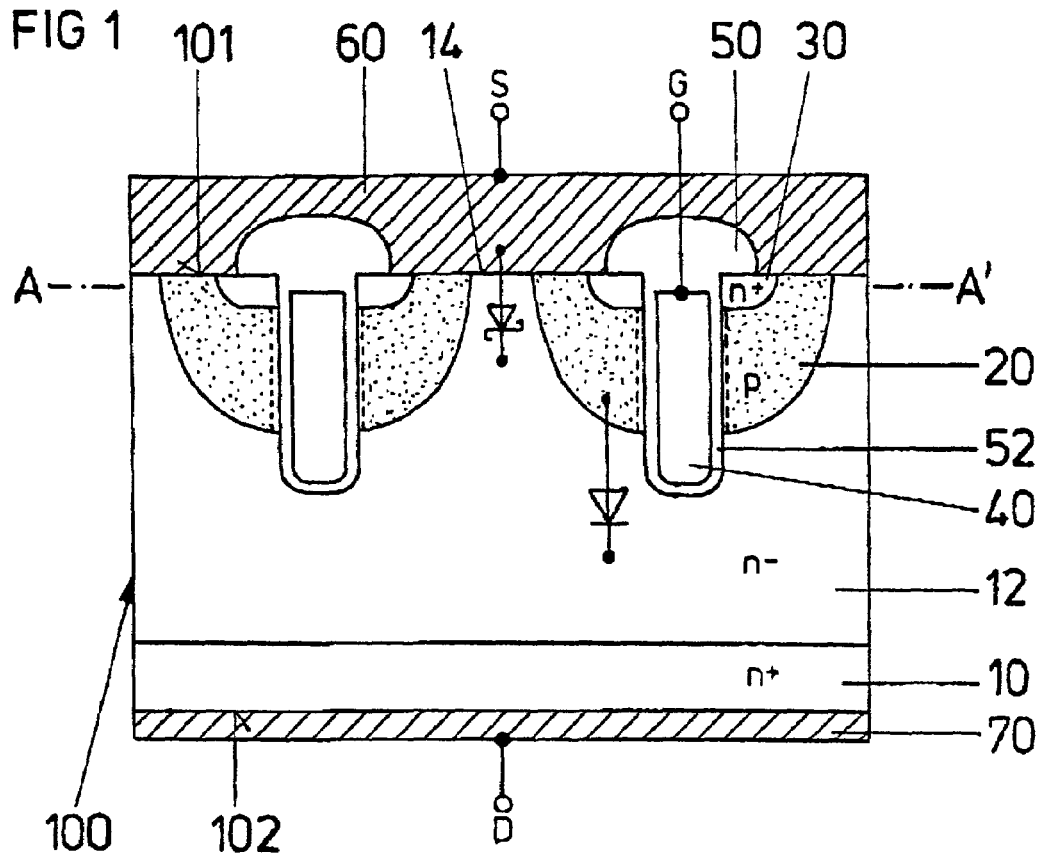
FIG. 1 shows a cross section through a semiconductor body with a semiconductor arrangement according to the invention in accordance with a first embodiment.

FIG. 1 shows a cross section through a semiconductor component according to the invention, which realizes an n-conducting MOS transistor and a Schottky diode connected in parallel with the drain-source path D-S of the MOS transistor. The MOS transistor has a multiplicity of identically constructed transistor cells which are connected up together, two such transistor cells being illustrated in FIG. 1.

The semiconductor component according to the invention has a semiconductor body 100 having a heavily n-doped zone 10, for example a substrate, and a more weakly n-doped zone 12, for example an epitaxial layer, applied on the heavily n-doped zone 10. p-doped zones 20 are introduced into the more weakly n-doped zone 12 from a front side 101 of the semiconductor body, heavily n-doped zones 30 being formed, in turn, in said zones 20, the p-doped zone 20 separating the heavily n-doped zone 30 and the more weakly n-doped zone 12 from one another.

The heavily n-doped zone 10 and the more weakly n-doped zone 12 form the drain zone of the MOS transistor, which is contact-connected by a metalization layer 70, forming the drain terminal D, at a rear side 102 of the semiconductor body. The p-doped zone 20 forms the body zone and the heavily n-doped zone 30 forms the source zone of the MOS transistor.

Proceeding from a front side 101 of the semiconductor body, trenches extend in the vertical direction of the semiconductor body 100 through the source zone 30 and the body zone 20 right into the more weakly n-doped zone 12, which acts as drift zone of the MOS transistor. Gate electrodes 40 are formed in the trenches, which electrodes likewise extend in the vertical direction 12, the gate electrodes 40 being insulated from the source, drift and body zones 30, 12, 20 by insulation layers 5. The drift zone 12, the body zone 20 and the source zone 30 are arranged one above the other on both sides of the trenches in the vertical direction of the semiconductor body 100.

The source zone 20 is contact-connected by a source electrode 60, this source electrode 60 also contact-connecting, in addition to the source zone 30, uncovered regions of the body zone 20 in the region of the front side 101 of the semiconductor body. The source electrode 60 short-circuits the source zone 30 and the body zone 20, as a result of which a parasitic bipolar transistor formed by the sequence of the n-doped drift zone 12, the p-doped body zone 20 and the n-doped source zone 30 is rendered ineffectual. The gate electrode 40 is insulated from the source electrode 60 by means of an insulation layer 50 formed above the gate electrode 40 at the front side 101 of the semiconductor body.

The source electrode furthermore contact-connects uncovered regions of the drift zone 12, which forms a part of the drain zone, adjacent to the body zone 20 in a region 14 of the front side 101. The source electrode 60 and the drift zone 12 form a Schottky contact in the region 14 of the front side of the semiconductor body 101, in which case the drift zone 12 may be doped more lightly, if appropriate, in this region than in the remaining regions. In the region of the Schottky contact, the source electrode S is composed of a metal, for example aluminum, or of a silicide, such as, for example tungsten silicide, tantalum silicide, platinum silicide, cobalt silicide or titanium silicide. In this case, the source electrode 60 may be formed completely from this material or may be constructed in layers, the source electrode 60 then having one of said materials in the region of the Schottky contact, over which material for example an aluminum layer or a highly doped layer made of n-conducting polysilicon may then be applied.

When a drive voltage is applied between the gate electrode 40 G and the source electrode S, a conductive channel running in the vertical direction between the source zone 30 and the drift zone 12 is formed along the trench in the body zone 20, which channel enables a current flow when a voltage is applied between the drain electrode 70, D and the source electrode 60, S. With application of a positive drain-source voltage which lies below the breakdown voltage of the Schottky contact, the Schottky contact is in the off state, and a current flow between the drain zone and the source zone is then only possible via the conductive channel—depicted by broken lines in the figures—in the body zone 20.

When a negative drain-source voltage is present, the Schottky contact is in the on state and enables a current flow between the source electrode S and the drain electrode D whilst bypassing the structure with the body zone 20, the source zone 30 and the gate electrode 40.

By virtue of the pn junction between the body zone 20 and the drift zone 12, a so-called body diode is present between the source electrode S and the drain electrode D, the circuit symbol of which body diode is depicted in FIG. 1. The forward voltage of this diode formed by the pn junction is greater than the forward voltage of the Schottky diode, so that when a negative drain-source voltage is applied, said body diode is not turned on, that is to say remains ineffectual.

Figure 7:
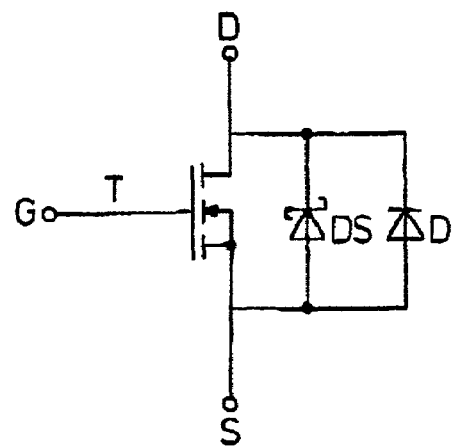
FIG. 7 shows an electrical equivalent circuit diagram of the semiconductor arrangement according to the invention.

FIG. 7 shows the electrical equivalent circuit diagram of this semiconductor arrangement according to the invention. The equivalent circuit diagram shows a MOS transistor T with a Schottky diode DS, which is connected in parallel with the drain-source path D-S of the MOS transistor and is formed by the Schottky contact between the source electrode 60 and the drift zone 12, and with a body diode D, which is connected in parallel with the drain-source path DS of the MOSFET and in parallel with the Schottky diode DS and is formed by the pn junction between the body zone 20 and the drift zone 12.

Figure 2A:
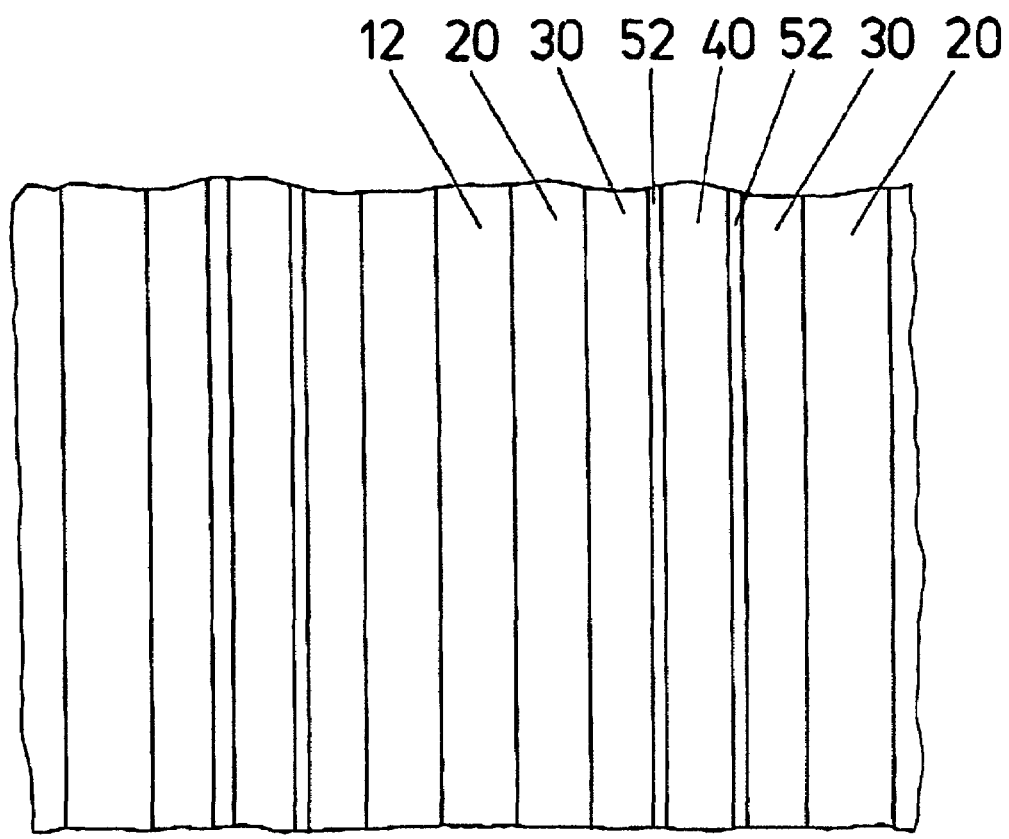
FIG. 2 shows a cross section through the semiconductor body in accordance with FIG. 1 in plan view in the case of a first embodiment (FIG. 2a), a second embodiment (FIG. 2b) and a third embodiment (FIG. 2c) with regard to an arrangement of the gate electrodes.
Figure 2B:
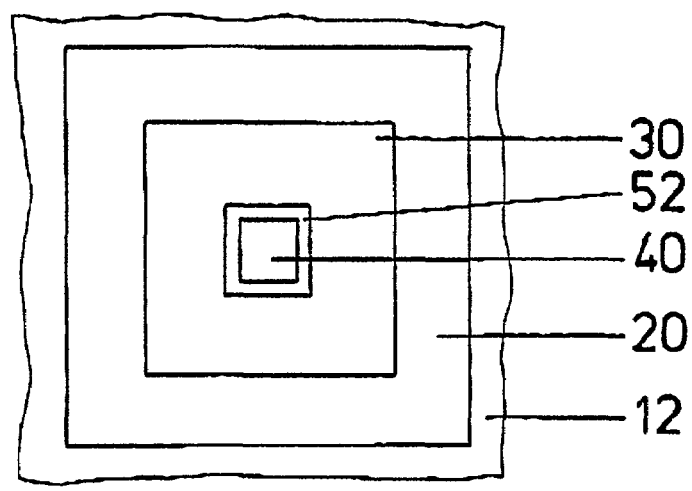

FIG. 2 shows a cross section through a semiconductor arrangement in accordance with FIG. 1 in a sectional plane A—A, FIG. 2a illustrating a first exemplary embodiment for the formation of the gate electrode 40 and FIG. 2b illustrating a second exemplary embodiment for the formation of the gate electrode 40.

In the exemplary embodiment in accordance with FIG. 2a, the gate electrode 40 and the insulating layer 52 arranged adjacent to the gate electrode 40, the p-doped body zone 20 and the n-doped source zone 30 run in elongate fashion in the lateral direction of the semiconductor body 100, i.e. perpendicularly to the plane of the drawing in accordance with FIG. 1.

In the exemplary embodiment in accordance with FIG. 2, the trench and the gate electrode 40 arranged therein are formed in a pillar-type manner, the insulation layer 52, the p-doped body zone 20 and the n-doped source zone 30 annularly surrounding the gate electrode.

Figure 2C:
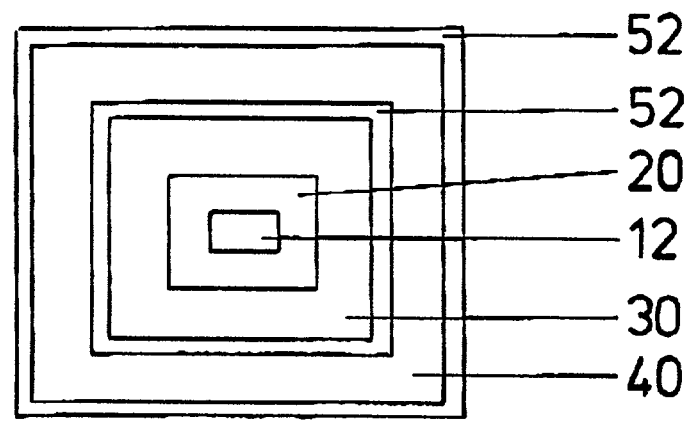

In the exemplary embodiment in accordance with FIG. 2c, the trench and the gate electrode 40 arranged therein are annularly arranged around the body zone 30, the source zone 20 and the drain zone 12.

Figure 3:
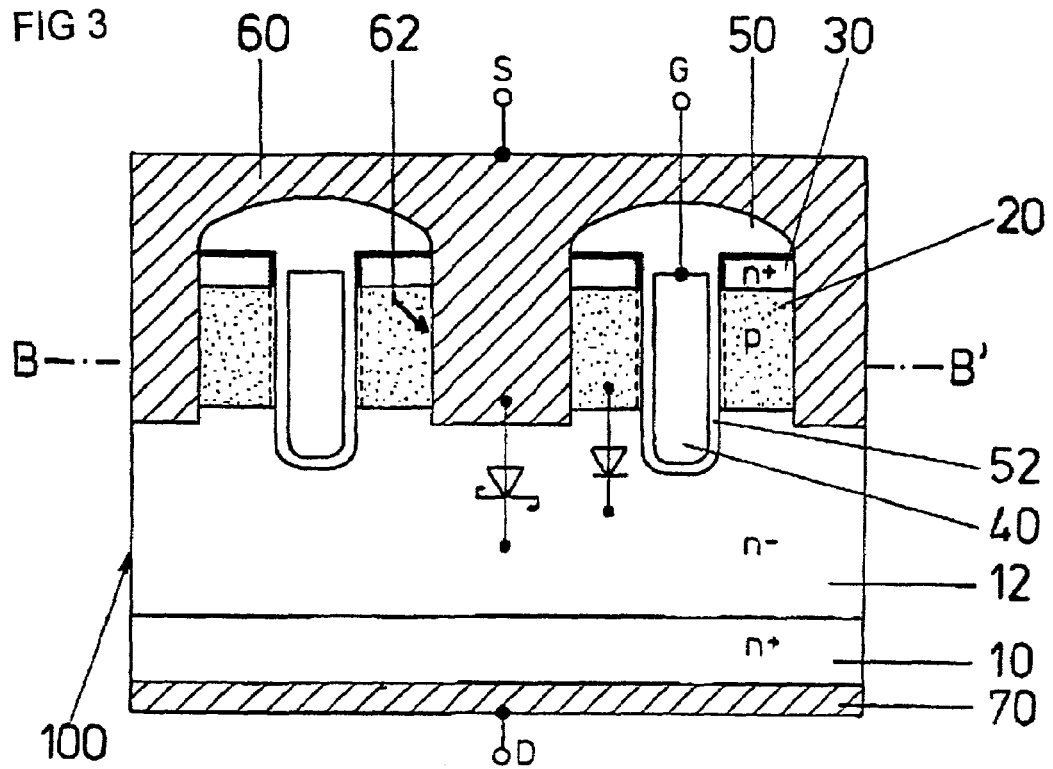
FIG. 3 shows a cross section through a semiconductor body with a semiconductor arrangement according to the invention in accordance with a second embodiment.

FIG. 3 shows a further exemplary embodiment of a semiconductor arrangement according to the invention in cross section. This semiconductor arrangement differs from the one illustrated in FIG. 1 by the formation of the source electrode 60. In the exemplary embodiment in accordance with FIG. 3, in addition to the trench in which the gate electrode 40 is formed, a second trench 62 extends into the semiconductor body proceeding from the front side 100, the trench 62 ending below the p-doped body zone 20. The source electrode 60 is formed in this trench 62, the Schottky contact being formed in the region of a bottom of said trench 62 between the source electrode 60 and the drift zone 12.

The source electrode S contact-connects the source zone 30 and the body zone 20 at side areas of said trench 62 and thereby short-circuits the body zone 20 and the source zone 30. In the exemplary embodiment in accordance with FIG. 3, unlike in the exemplary embodiment in accordance with FIG. 1, space for the short-circuiting of the source zone 30 and the body zone 20 by means of the source electrode 60 need not be provided at the front side 101 of the semiconductor body since, in the exemplary embodiment in accordance with FIG. 6, the short circuit is not effected at the front side 101 but rather at a side area of the trench 62 running in the vertical direction of the semiconductor body 100. Consequently, in the exemplary embodiment in accordance with FIG. 3, a higher packing density can be obtained, i.e. it is possible to realize a larger number of transistor cells on a given area.

Furthermore, a possible fabrication method for the semiconductor arrangement in accordance with FIG. 3 is simplified relative to a method for the semiconductor arrangement in accordance with FIG. 1.

In the fabrication of a semiconductor arrangement in accordance with FIG. 1, masks have to be applied to the front side of the semiconductor body 101 for the fabrication of the p-doped body zones 20 and the source zones 30, which masks firstly ensure that, during the indiffusion of the p-doped zone 20, n-doped regions of the drift zone 12 which are later contact-connected in order to form the Schottky contact remain at the front side 101. Furthermore, regions of the body zone 20 which is uncovered at the front side 101 of the semiconductor body must be covered during the indiffusion of the source zone 30.

In a fabrication method for fabricating a semiconductor arrangement in accordance with FIG. 3, the epitaxial layer 12 can be p-doped from the front side 101 of the semiconductor body in order to form the p-doped body zone 20 on the entire area, in which case a heavily n-doped zone 30 can subsequently be introduced by doping on the entire area of the front side 101. The trench 62 is subsequently produced, which trench reaches through the source zone 30 and the body zone 20 right into the drift zone 12.

In the exemplary embodiment in accordance with FIG. 3, too, the Schottky contact is formed following the contact between the source electrode 60 and the body zone 20. Consequently, in the semiconductor component according to the invention, a Schottky contact is provided adjacent to each connection of the source electrode 60 to the body and source zones 20, 30. The cells of the semiconductor component according to the invention are thus constructed identically, each transistor cell being assigned a Schottky contact, which leads, in the event of a Schottky diode formed by the individual Schottky contacts being turned on, to more uniform current distribution over the component. Moreover, all the cells of the semiconductor component can be fabricated by the same method steps.

Figure 4:
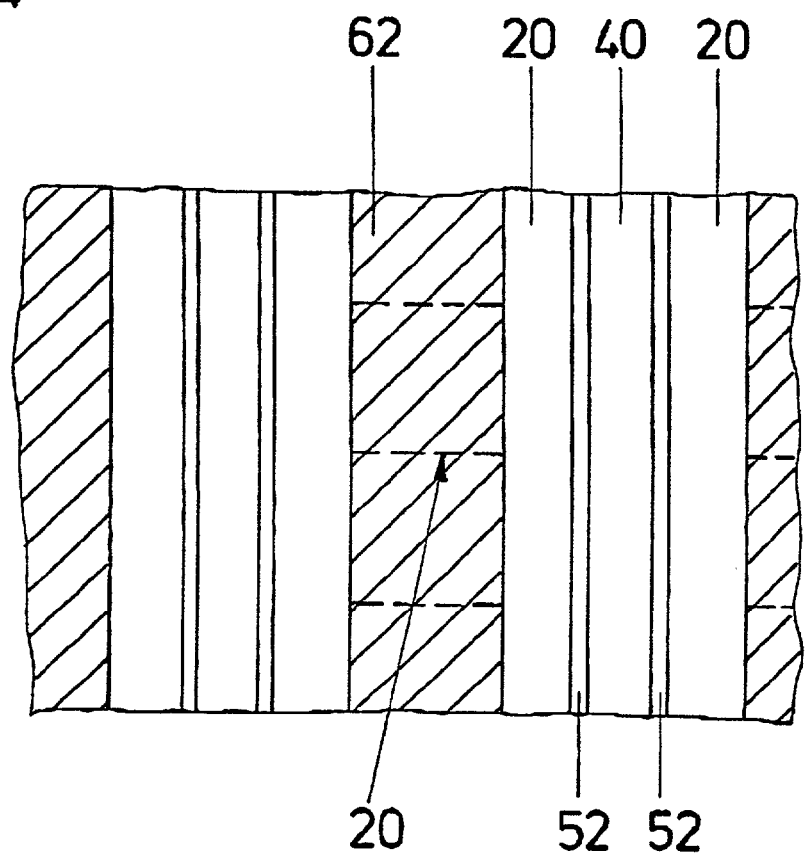
FIG. 4 shows a cross section through the semiconductor body in accordance with FIG. 3 in plan view.

FIG. 4 shows a cross section through the semiconductor arrangement in accordance with FIG. 3, in the exemplary embodiment the gate electrode 40 and the insulation layer 52 arranged adjacent to the gate electrode 40, and the body zone 20 or the source zone 30 being formed in elongate fashion in the lateral direction of the semiconductor body 100. In this case, the trench 62 with the source electrode 60 arranged therein may likewise run in elongate fashion in the lateral direction of the semiconductor body, as shown by the hatched zones in FIG. 4. It is also possible to provide rectangular trenches spaced apart from one another, into which the source electrode extends, as is illustrated by the broken lines in FIG. 4, the regions situated between these trenches 62 being filled by the p-doped body zone 20 and, lying above the latter, by the source zone 30.

Figure 5:
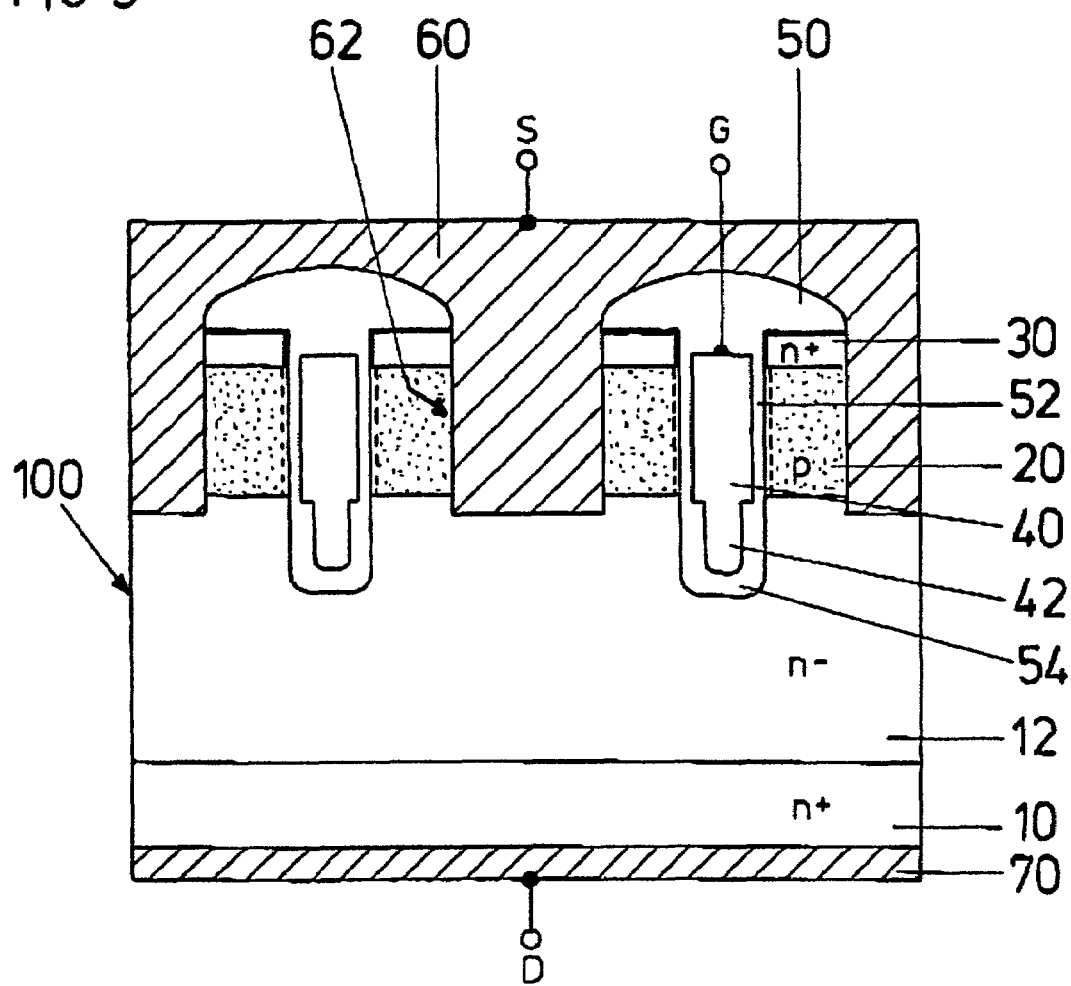
FIG. 5 shows a cross section through a semiconductor body with a semiconductor arrangement according to the invention in accordance with a third embodiment.

FIG. 5 shows a further exemplary embodiment of a semiconductor arrangement according to the invention, which differs from the semiconductor arrangement illustrated in FIG. 4 by the fact that the gate electrode 40 is formed as field plate 42 in a region of the trench which is formed in the drift zone 12. To that end, the electrode tapers in this region and is surrounded, opposite the drift zone 12, by a thicker insulation layer 54 than in the region of the body zone 20 and the source zone 30.

The formation of the gate electrode 40 as field plate 42 in the region of the drift zone 12 increases the dielectric strength of the MOS transistor, which is critically determined by the thickness of the gate insulation.

Figure 6:
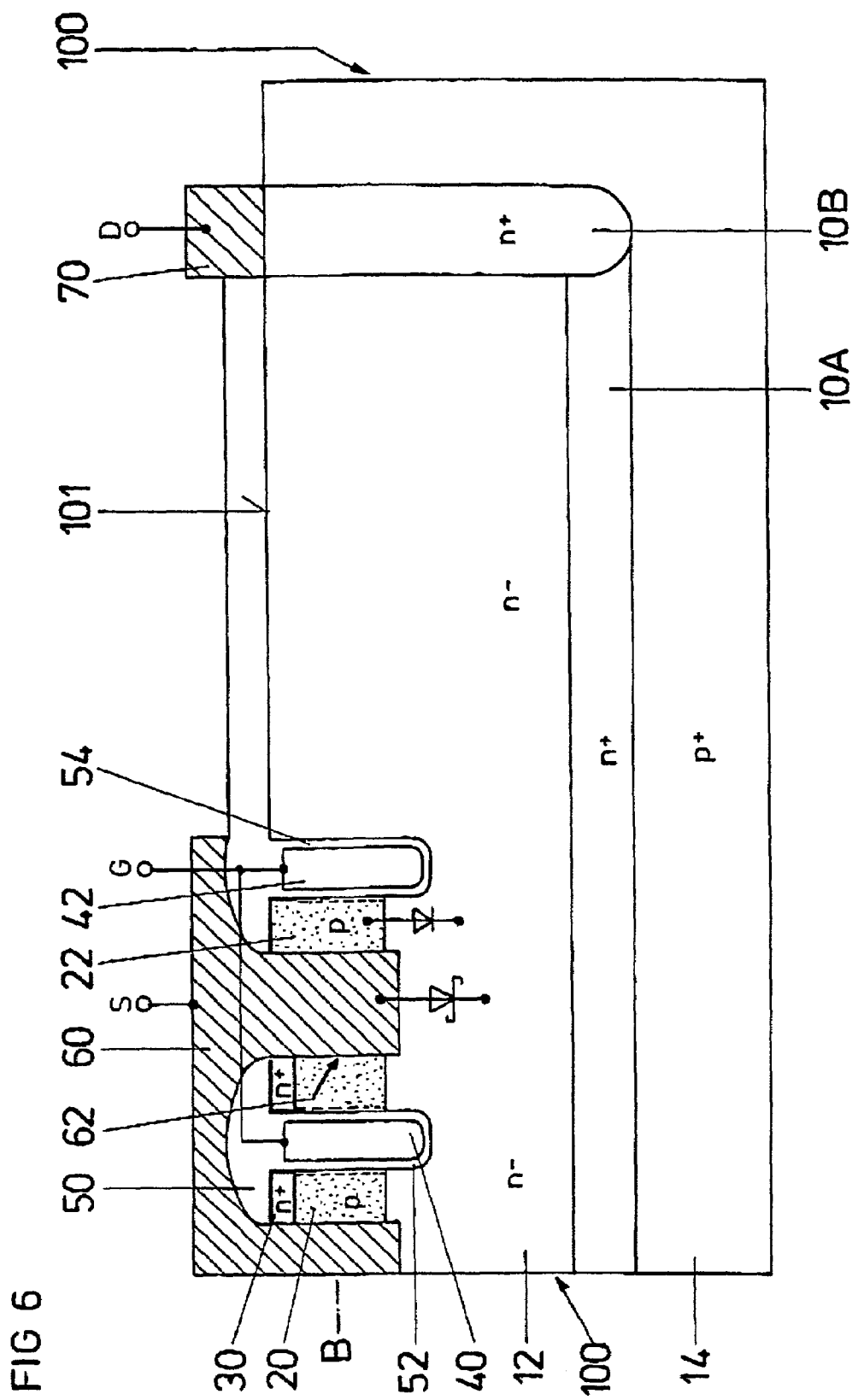
FIG. 6 shows a cross section through a semiconductor body with a semiconductor arrangement according to the invention in accordance with a further embodiment.

FIG. 6 shows a further exemplary embodiment of a semiconductor arrangement according to the invention, in which the MOS transistor is realized as a so-called drain-up transistor. In this transistor, the drain zone is not contact-connected at a rear side of the semiconductor body but rather, like the source zone 30 and the gate electrode 40 as well, from a front side of the semiconductor body. In this embodiment, the drain zone 10a is formed as a buried heavily n-doped layer on a semiconductor substrate 14, a heavily p-doped semiconductor substrate in FIG. 6. Moreover, a heavily n-doped region 10B is provided, which runs in the vertical direction of the semiconductor body 100 and connects the buried layer 10A to a drain electrode 70 at the front side 101 of the semiconductor body 100.

A field plate 42 is provided as edge termination of the cell array, of which only the gate electrode 40 and the source zone 30 is illustrated, which field plate, like the gate electrode 40, is formed in a trench extending in the vertical direction and is insulated from the semiconductor body 100 by means of an insulation layer 54. The field plate 42 is connected to the gate electrode 40. However, there is no source zone arranged in the body zone 22 adjacent to the field plate, so that a conductive channel cannot form adjacent to the field plate. The task of the field plate 42 is to influence the field strength profile at the edges of the cell array in such a way that the probability of a breakdown upon application of a reverse voltage is not higher there than within the cell array.

The field plate forming the termination of the cell array is formed such that it is spaced apart in the lateral direction from the region 10B, or the drain terminal 70. The semiconductor region between the field plate 42 and the drain terminal 70 is more weakly n-doped like the drift zone 12.

For the rest, the construction of the semiconductor arrangement with regard to the Schottky contact between the source electrode 60 and the drift zone 12, with regard to the source electrode 60 and with regard to the gate electrode 40 corresponds to the construction of the semiconductor arrangement in accordance with FIG. 3, to which reference is made.

It is also possible, of course, to use the structures in accordance with FIGS. 1 and 4 in a drain-up transistor in accordance with FIG. 6.

FIGS. 8 to 12 show exemplary embodiments of a semiconductor component according to the invention which has regions with Schottky contacts between the first terminal electrode 60 and the drift zone 12 and regions without Schottky contacts between the terminal electrode 60 and the drift zone 12. In this case, FIGS. 8a, 10a, 11a and 12a show cross sections through sections of the semiconductor component in which Schottky contacts are present and FIGS. 8b, 10b, 11b and 12b show cross sections through sections of the semiconductor component in which such Schottky contacts are not present. In order to prevent a Schottky contact at the boundary regions between the terminal electrode 12 and the drift zone, in said boundary regions the drift zone 12 is doped complementarily with respect to the remaining regions of the drift zone 12, that is to say p-doped in the exemplary embodiments.

Apart from the fact that, in the exemplary embodiments in accordance with FIGS. 8 and 10 to 12, Schottky diodes are not formed between all the transistor cells, the semiconductor component in accordance with FIG. 8 corresponds to that in accordance with FIG. 1, the semiconductor component in accordance with FIG. 10 corresponds to that in accordance with FIG. 3, and the semiconductor components in accordance with FIGS. 11 and 12 correspond to that in accordance with FIG. 5.

Figure 8A:
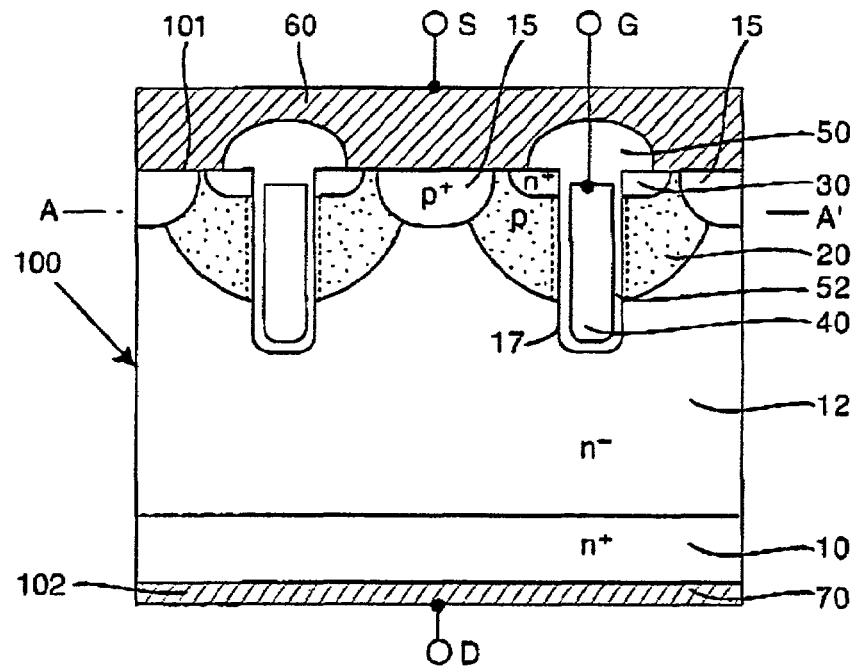
FIG. 8 shows cross sections through a semiconductor body at two different positions, in which is realized a semiconductor component according to the invention in accordance with a first embodiment, having regions with Schottky contacts and regions without Schottky contacts.
Figure 8B:
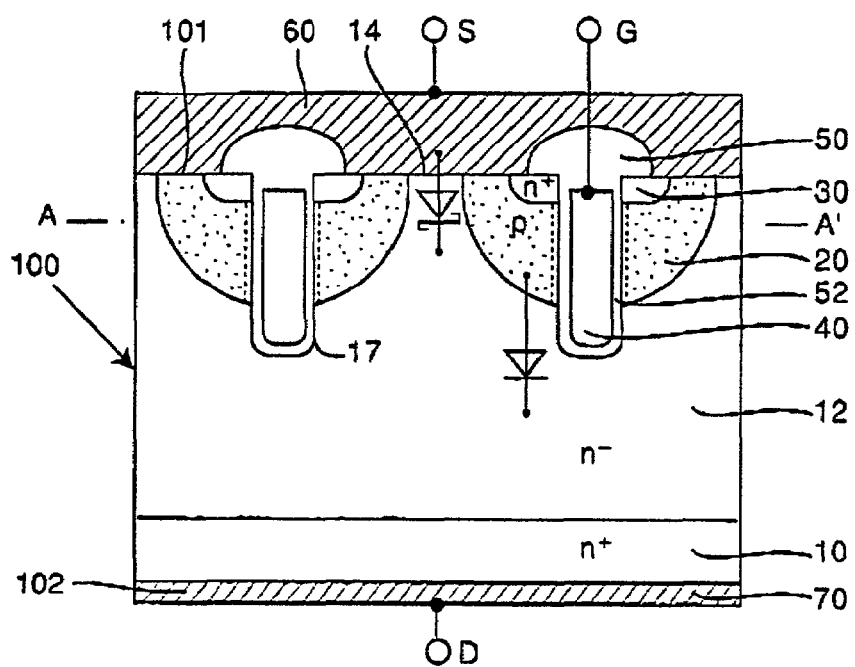

FIGS. 8a and 8b each show a cross section through an exemplary embodiment of the semiconductor arrangement according to the invention, FIG. 8a showing a section of the component in which no Schottky contacts are present, and FIG. 8b showing a section of the component in which Schottky contacts are present. This exemplary embodiment realizes an n-conducting MOS transistor with a Schottky diode connected in parallel with the drain-source path D-S of the MOS transistor. In this case, the MOS transistor has a multiplicity of identically constructed transistor cells which are connected up together, FIGS. 8a and 8b illustrating different transistor cells, namely cells without a Schottky contact (FIG. 8a) and cells with a Schottky contact (FIG. 8b).

The cells with a Schottky contact and the cells without a Schottky contact differ in that, in the cells without a Schottky contact, heavily p-doped ($p^+$-doped) regions are arranged in the drift zone 12 of the semiconductor body 100 in the region of the front side thereof, which are contact-connected by the source electrode 60 in addition to the source zone 30 and the body zone 20. In the cells with a Schottky contact, the source electrode contact-connects uncovered regions of the drift zone 12 at the front side of the semiconductor body 100 in the manner already explained.

The $p^+$-conducting regions 15 fulfil two tasks: they produce an ohmic contact with the body zone 20; furthermore, the breakdown voltage can be set by way of their depth. As a result, it is also possible to reduce the breakdown voltage in the regions without a Schottky diode, so that the maximum electric field at the Schottky diode can be limited. The drift zone 12 may be doped more lightly, if appropriate, in the region 14, in which the Schottky contact is formed, than in the remaining regions. This is because, for the realization of a Schottky contact, the doping at the surface in silicon should be less than $1 \times 10^{17}$ charge carriers $cm^{-3}$. In other words, the doping concentration of the semiconductor body lies below this value in the region 14.

The doping of the semiconductor body 100 adjoining the top side 101 may also deviate from the doping of the rest of the epitaxial layer in the region 14.

In the region 14 of the Schottky contact, the source electrode 60 is composed of a metal, for example aluminum, or of a silicide, such as, for example, tungsten silicide, tantalum silicide, platinum silicide, cobalt silicide or titanium silicide. In this case, the source electrode 60 may be formed completely from said material; however, it may also be constructed in layers, in which case the source electrode 60 then has one of said materials in the region 14 of the Schottky contact, over which material for example an aluminum layer or a highly doped layer made of n-conducting polycrystalline silicon can then be applied.

When a drive voltage is applied between the gate electrode 40 (G) and the source electrode 60 (S), a conductive channel running in the vertical direction between the source zone 30 and the drift zone 12 is formed along the trench in the body zone 20, which channel enables a current flow if a voltage is present between the drain electrode 70 (D) and the source electrode 60 (S). If a positive drain-source voltage is present which is below the breakdown voltage of the Schottky contact in the region 14, then the Schottky contact is in the off state. A current flow is then possible between the drain zone and the source zone 60 only via a conductive channel—depicted by broken lines in the FIGS.—in the body zone 20.

When a negative drain-source voltage is applied, the Schottky contact in the region 14 turns on and enables a current flow between the source electrode 60 and the drain electrode 70 whilst bypassing the structure with the body zone 20, the source zone 30 and the gate electrode 40.

By virtue of the pn junction between the body zone 20 and the drift zone in all the transistor cells and the p$^+$-conducting region 15 and the drift zone 12 in the cells without a Schottky contact, a so-called body diode is present between the source electrode 60 and the drain electrode 70, the circuit symbol of which body diode, like that of the Schottky diode, is depicted in the figures. The forward voltage of this diode formed by the pn junction is greater than the forward voltage of the Schottky diode, so that when a negative drain-source voltage is applied, said body diode is not turned on or is only turned on at high currents. In other words, this body diode remains essentially ineffectual. In any event, the injection of minority charge carriers is at least greatly reduced.

The cells of the semiconductor arrangement are thus constructed essentially identically, the transistor cells or transistor regions being assigned, in a specific ratio (for example in the ratio 1:1), Schottky contacts or p$^+$-conducting regions 15 for preventing Schottky contacts. This leads, in the event of the Schottky diodes formed by the individual Schottky contacts in the regions 14 being turned on, to more uniform current distribution over the semiconductor arrangement. Moreover, all the cells of the semiconductor arrangement can be fabricated, in principle, by the same method steps.

The electrical equivalent circuit diagram in accordance with FIG. 8 also applies to the embodiments in accordance with FIGS. 8 and 10 to 12.

FIG. 9 shows a cross section through the semiconductor arrangement of the exemplary embodiment of FIG. 1 in a sectional plane A–A', three different embodiments for the configuration of the gate electrode 40, the body zone 20 and the source zone 30 being specified.

Figure 9A:
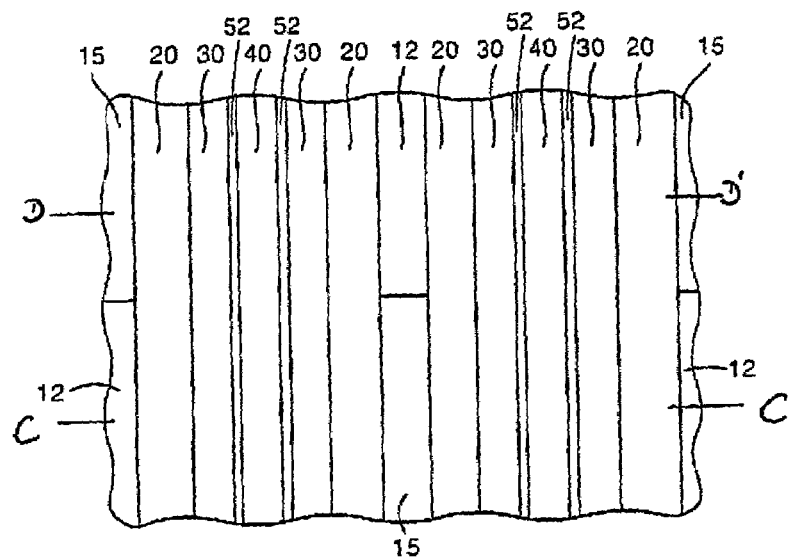
FIG. 9 shows a cross section through the semiconductor body in accordance with FIG. 8 in plan view for a first embodiment (FIG. 9a), a second embodiment (FIG. 9b) and a third embodiment (FIG. 9c) for the configuration of the gate electrodes.

In the embodiment in accordance with FIG. 9a, the gate electrode 40 and the insulation layer 52 arranged adjacent to the gate electrode 40, the p-doped body zone 20 and the n-doped source zone 30 run in elongate fashion in the lateral direction of the semiconductor body 100, that is to say perpendicularly to the plane of the drawing in accordance with FIG. 8, the p$^+$-doped regions 15 and the regions 14 with a Schottky contact alternating with one another in the longitudinal direction of, for example, the gate electrode. FIG. 8b illustrates, for example, a cross section along the sectional plane C–C' depicted in FIG. 9a and FIG. 8a illustrates a cross section along the sectional plane D–D'.

Figure 9B:
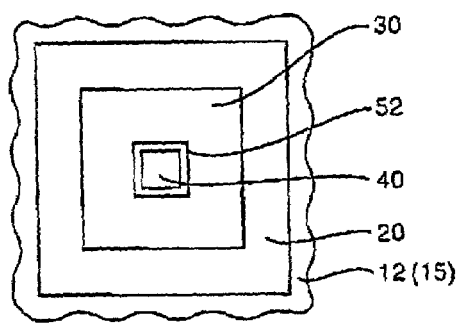

In the embodiment in accordance with FIG. 9b, the trench and the gate electrode 40 arranged therein are formed in a pillar-type manner, the insulation layer 52, the p-doped body zone 20 and the n-doped source zone 30 annularly surrounding the gate electrode 40. In this case, regions with a Schottky contact, in which the drift zone 12 is uncovered at the front side, and regions without a Schottky contact, in which p$^+$-doped regions 15 are uncovered at the front side, may be arranged in a chessboard-like manner, for example.

Figure 9C:
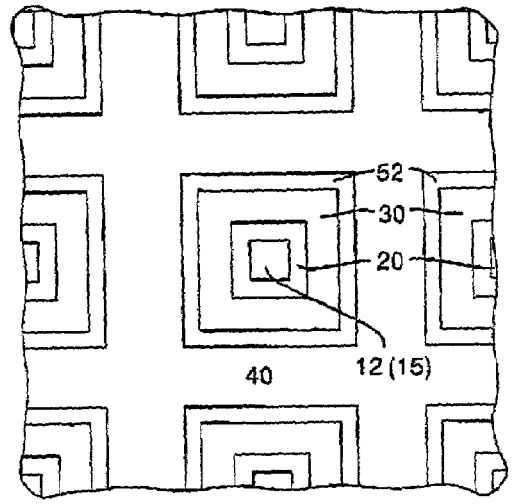

In the embodiment in accordance with FIG. 9c, the trench and the gate electrode 40 arranged therein are arranged annularly around the body zone 30, the source zone 20 and the highly doped region 15 or the drain zone which reaches the surface 101 in the region 14. In this case, too, the regions with a Schottky contact 12 or 14 and the regions without a Schottky contact 15 may be configured in a chessboard-like manner.

Figure 10A:
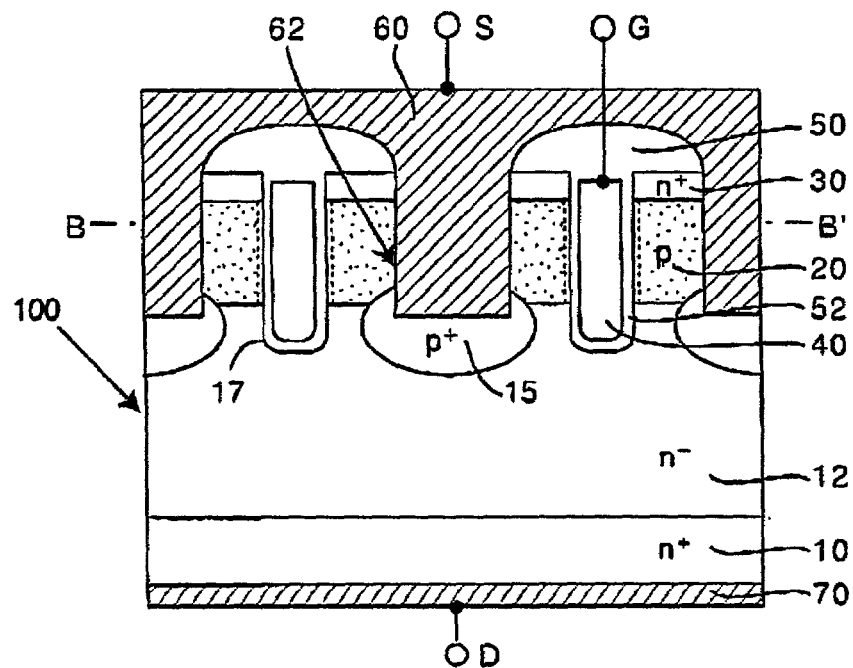
FIG. 10 shows cross sections through a semiconductor body at two different positions, in which is realized a semiconductor component according to the invention in accordance with a second embodiment, having regions with Schottky contacts and regions without Schottky contacts.
Figure 10B:
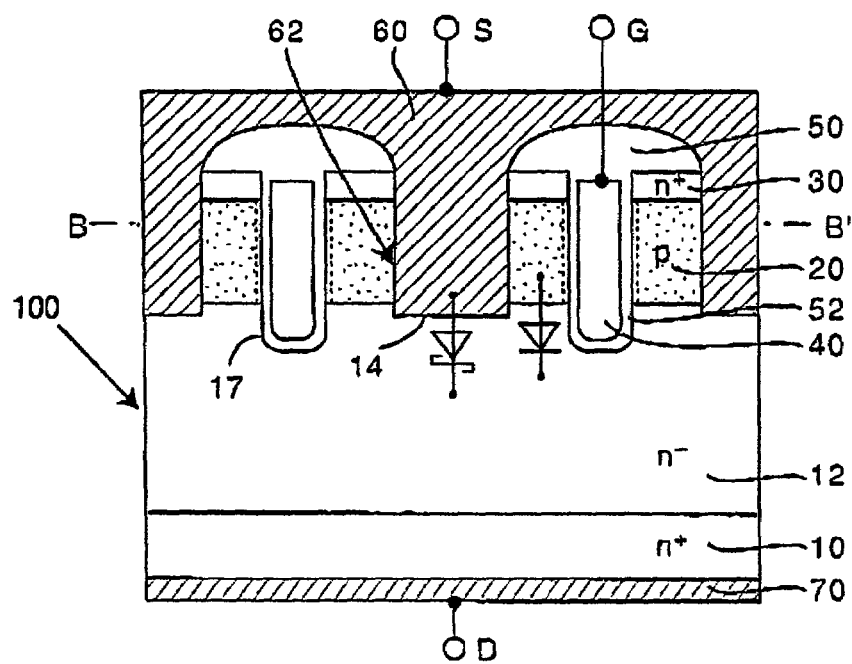

FIGS. 10a and 10b show a further exemplary embodiment of the semiconductor arrangement according to the invention in cross section. This semiconductor arrangement differs from the semiconductor arrangement illustrated in FIGS. 8a and 8b by virtue of the formation of the source electrode 60. In the exemplary embodiment in accordance with FIG. 3, in addition to the trench in which the gate electrode 40 is formed, a second trench 62 extends into the semiconductor body 100 proceeding from the front side 101, this trench 62 ending below the p-doped body zone 20. The source electrode 60 is formed in this trench 62, the Schottky contact being formed in the region 14 of a bottom of said trench 62 between the source electrode 60 and the drift zone 12. Regions 14 with a Schottky contact and p$^+$-conducting regions 15 for preventing a Schottky contact between the source electrode 60 and the drift zone 12 alternate with one another in this case.

At side areas of said trench 62, the source electrode 60 contact-connects the source zone 30 and, in the case of a p$^+$-type implantation of the side wall, also the body zone 20 and then short-circuits the body zone 20 and the source zone 30 as a result.

A possible fabrication method for the semiconductor arrangement in accordance with FIGS. 10a and 10b is configured in a simpler manner compared with a method for fabricating the semiconductor arrangement in accordance with FIGS. 8a and 8b.

In a fabrication method for the semiconductor arrangement of the exemplary embodiment of FIGS. 10a and 10b, the epitaxial layer of the zone 12 may be p-doped from the front side 101 of the semiconductor body 100 in order to form the p-doped body zone 20 on the entire area, a heavily n-doped zone 30 subsequently being indiffused on the entire front side 101. The trench 62 is then produced, which reaches through the source zone 30 and the body zone 20 right into the drift zone 12.

In the exemplary embodiment in accordance with FIGS. 10a and 10b, the Schottky contact or the p$^+$-doped region 15 is formed below the source electrode 60 and the body zone 20. The p$^+$-doped regions can be produced after the fabrication of the trench or contact hole for the source electrode 60, for example by means of an implantation method with subsequent diffusion step, a suitable mask being used to cover those regions at the bottom of the trenches or contact holes in which no p-type doping is intended to be effected, in order to form Schottky contacts there after the removal of the mask and the fabrication of the source electrode 60.

A Schottky contact (cf. FIG. 10b) or a p$^+$-conducting region 15 (cf. FIG. 10a) is thus provided adjacent to each connection of the source electrode 60 to the body zone 20 and the source zone 30.

The cross section B–B' through the semiconductor component in accordance with FIGS. 10a and 10b corresponds to the cross section illustrated in figure [lacuna].

Figure 11A:
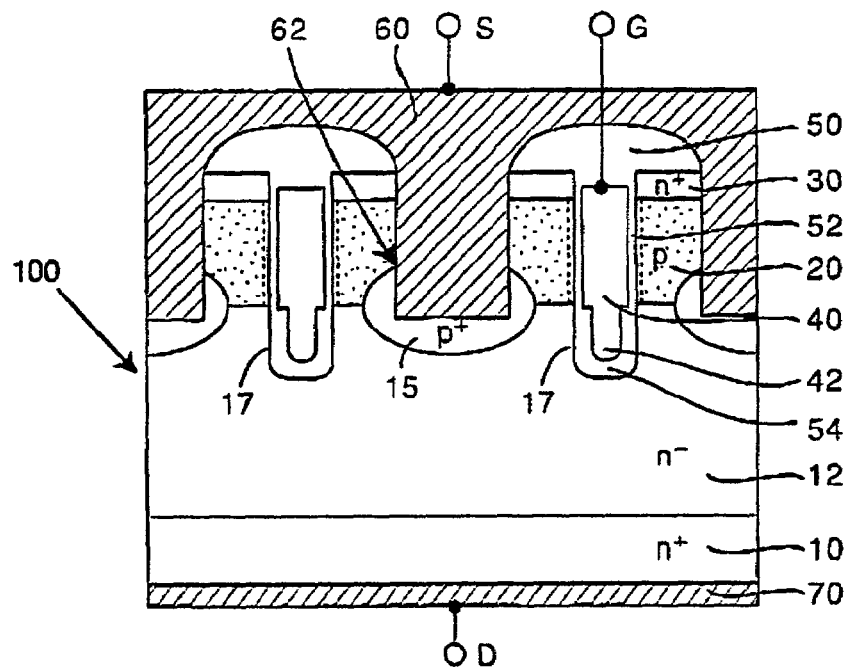
FIG. 11 shows cross sections through a semiconductor body at two different positions, in which is realized a semiconductor component according to the invention in accordance with a third embodiment, having regions with Schottky contacts and regions without Schottky contacts.
Figure 11B:
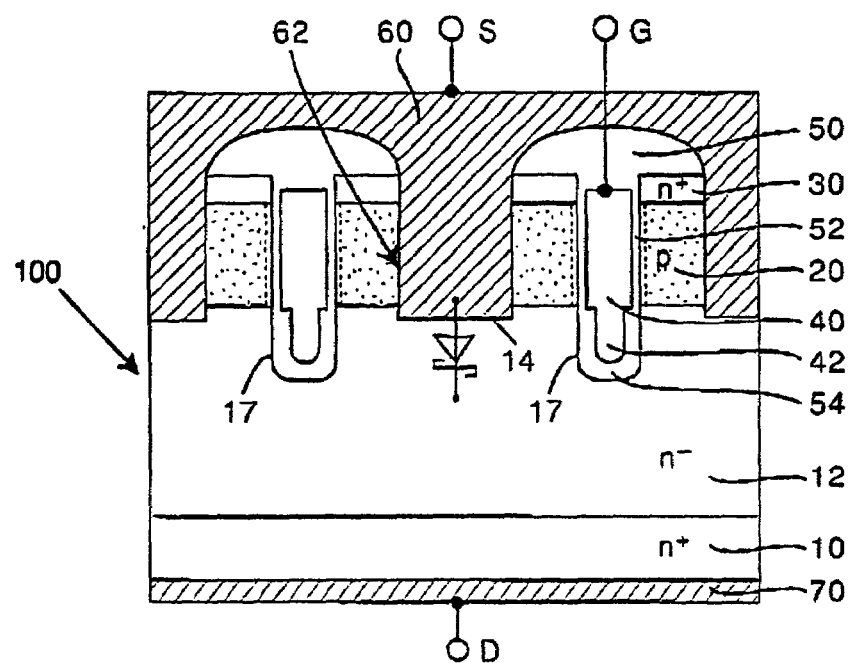

FIGS. 11a and 11b show a further exemplary embodiment of the semiconductor arrangement according to the invention, this exemplary embodiment differing from the exemplary embodiment of FIGS. 10a, 10b and 4 in that the gate electrode 40 is formed as field plate 42 in a region of the trench which is formed in the drift zone 12. In this case, the electrode 40 tapers in this region and is surrounded, opposite the drift zone 12, by a thicker insulation layer 54 than in the region of the body zone 20 and the source zone 30.

The formation of the gate electrode 40 as field plate 42 in the region of the drift zone 12 increases the dielectric strength of the MOS transistor.

Figure 12A:
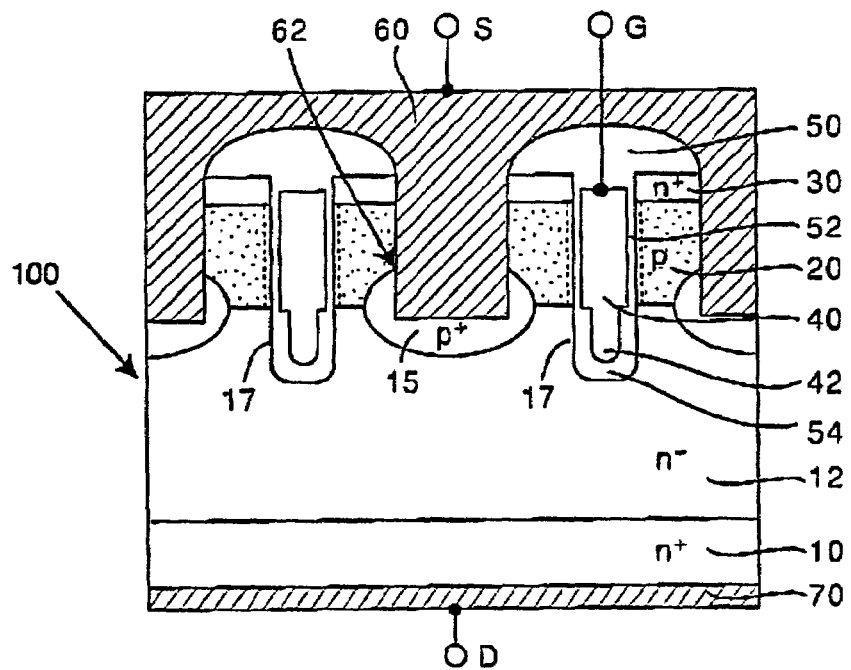
FIG. 12 shows cross sections through a semiconductor body at two different positions, in which is realized a semiconductor component according to the invention in accordance with a fourth embodiment, having regions with Schottky contacts and regions without Schottky contacts.
Figure 12B:
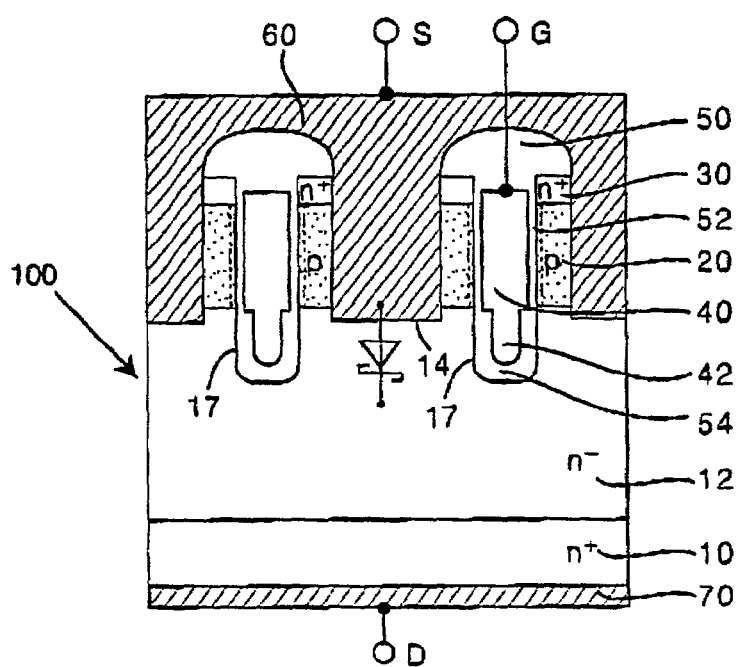

FIGS. 12a and 12b show a further exemplary embodiment of the semiconductor arrangement according to the invention, in which Mesa regions ("Mesas"), which, between the trenches 17 of the gate electrodes, essentially have the source zones 30 and the body zones 20 and also the insulation layer 52 and, if appropriate, the further trench 62, are narrower in regions 14 with Schottky contacts (cf. FIG. 12b) than in the regions without a Schottky contact.

Finally, it shall be pointed out that in the case of a drain-up transistor in accordance with FIG. 7 as well, it is possible to provide mutually alternating regions 14 with a Schottky contact and heavily p$^+$-doped regions 15. In FIG. 7, a p$^+$-doped region 15 for preventing a Schottky contact is indicated by broken lines and illustrated in addition to the region 14. In actual fact, the regions 14 with a Schottky contact and the heavily p-doped regions 15 are configured one after the other or next to one another in the cell array of the semiconductor arrangement.

The edge termination of the cell arrays of the above exemplary embodiments is of a customary type.

The MOS transistors of the above exemplary embodiments are n-channel MOSFETs. The invention can also be applied in the same way to p-channel MOSFETs. Equally, it is possible also to form an IGBT instead of a MOS transistor for the semiconductor arrangement according to the invention.

We claim:

1. A semiconductor configuration, comprising:
   a semiconductor body including a first terminal zone of a first conductivity type, a second terminal zone of said first conductivity type, and a body zone of a second conductivity type formed between said first terminal zone and said second terminal zone, said semiconductor body defining a vertical direction, said first terminal zone, said body zone, and said second terminal zone configured one above another at least in sections in said vertical direction of said semiconductor body, said semiconductor body formed with a first trench extending in said vertical direction of said semiconductor body from said second terminal zone through said body zone right into said first terminal zone, said semiconductor body formed with a second trench extending in said vertical direction of said semiconductor body and said second trench defining sidewalls;
   a control electrode formed in said first trench and insulated from said semiconductor body;
   a terminal electrode insulated from said control electrode and contact-connecting said second terminal zone and said body zone, said terminal electrode disposed in sections in said second trench; and
   a Schottky contact formed between said terminal electrode and said first terminal zone;
   said Schottky contact directly contacting said body zone and formed in said second trench;
   said body zone and said second terminal zone being uncovered at said sidewalls of said second trench and being contact-connected by said terminal electrode.

2. The semiconductor configuration according to claim 1, wherein: said semiconductor body has a front side; said first terminal zone extends in sections as far as said front side of said semiconductor body; and said Schottky contact is formed at said front side of said semiconductor body.

3. The semiconductor configuration according to claim 1, wherein:
   said semiconductor body is composed of silicon and includes a given region; and
   in order to form said Schottky contact in said given region, said first terminal zone has a doping in said given region that is less than $1*10^{17}$.

4. The semiconductor configuration according to claim 1, wherein:
   said semiconductor body is composed of silicon and includes a given region in which said Schottky contact is formed; and
   said terminal electrode, in said given region of said Schottky contact, includes a material selected from a group consisting of aluminum, tungsten silicide, tantalum silicide, platinum suicide, cobalt suicide, and titanium suicide.

5. The semiconductor configuration according to claim 1, wherein: said control electrode is a field plate formed in said first terminal zone; said semiconductor body includes an insulation layer surrounding said field plate; and said insulation layer is thicker near said first terminal zone than near said body zone and said second terminal zone.

6. The semiconductor configuration according to claim 1, wherein said semiconductor body includes first regions with a Schottky contact and second regions without a Schottky contact that are configured in a transition region between said first terminal electrode and said first terminal zone.

7. The semiconductor configuration according to claim 6, wherein said first regions and said second regions alternate with one another.

8. The semiconductor configuration according to claim 7, wherein said second regions are doped more highly than said first terminal zone.

9. The semiconductor configuration according to claim 7, wherein: said first regions have a higher breakdown voltage than said second regions.

10. The semiconductor configuration according to claim 9, wherein said second regions are doped more highly than said first terminal zone.

11. The semiconductor configuration according to claim 6, wherein said second regions are doped more highly than said first terminal zone.

12. The semiconductor configuration according to claim 6, wherein: said first regions have a higher breakdown voltage than said second regions.

13. The semiconductor configuration according to claim 6, wherein said second regions are of said second conductivity type.

14. The semiconductor configuration according to claim 13, wherein: said second regions are doped more highly than said first terminal zone; and said second regions also serve as a contact for said body zone.

15. The semiconductor configuration according to claim 6, wherein: said second regions are doped more highly than said first terminal zone; and said second regions also serve as a contact for said body zone.

16. The semiconductor component according to claim 6, wherein: said semiconductor body has a front side; said first terminal zone extends in sections as far as said front side of said semiconductor body; and said first regions and said second regions are formed at said front side of said semiconductor body.

17. The semiconductor configuration according to claim 6, wherein:
said first regions and said second regions adjoin said second trench.

18. The semiconductor configuration according to claim 6, wherein:
said semiconductor body is formed with a plurality of trenches extending in said vertical direction of said semiconductor body;
said semiconductor body includes a plurality of mesa regions, each one of said plurality of said mesa regions formed between a respective pair of said plurality of said trenches;
said plurality of mesa regions are formed with a plurality of further trenches, a plurality of body zones, and a plurality of second terminal zones;
first ones of said plurality of said mesa regions each include a Schottky contact, and second ones of said plurality of said mesa regions each do not include a Schottky contact; and
said first ones of said plurality of said mesa regions are narrower than said second ones of said plurality of said mesa regions.

19. The semiconductor configuration according to claim 1, wherein:
said semiconductor body includes regions with a Schottky contact; and
in said regions, a Schottky barrier voltage is set by ion implantation.

20. The semiconductor configuration according to claim 1, comprising:
a second terminal electrode;
said semiconductor body including a side opposite said first terminal electrode; and
said second terminal electrode provided on said side of said semiconductor body opposite said first terminal electrode.

21. The semiconductor configuration according to claim 1, comprising:
a second electrode;
said semiconductor body including a side; and
said first terminal electrode and said second terminal electrode provided on said side of said semiconductor body.

22. A semiconductor configuration, comprising:
a semiconductor body containing a plurality of identically configured cells and defining a vertical direction, each of said cells containing:
a first terminal zone of a first conductivity type;
a second terminal zone of said first conductivity type;
a body zone of a second conductivity type formed between said first terminal zone and said second terminal zone;
said first terminal zone, said body zone, and said second terminal zone configured one above another at least in sections in said vertical direction of said semiconductor body;
said semiconductor body having a first trench formed therein extending in said vertical direction from said second terminal zone through said body zone right into said first terminal zone;
said semiconductor body having a second trench formed therein extending in said vertical direction of said semiconductor body;
a control electrode disposed in said first trench and insulated from said semiconductor body;
a terminal electrode insulated from said control electrode and contact connecting said second terminal zone and said body zone, said terminal electrode formed in said second trench; and
a Schottky contact formed by and between said terminal electrode and said first terminal zone, said Schottky contact directly contacting said body zone and formed in said second trench;
said body zone and said second terminal zone being contact-connected by said terminal electrode in said second trench.

* * * * *